United States Patent [19]

MacDougall et al.

[11] Patent Number: 5,729,005
[45] Date of Patent: Mar. 17, 1998

[54] FIBER OPTIC CURRENT SENSOR WITH BEND BIREFRINGENCE COMPENSATION

[75] Inventors: Trevor W. MacDougall, Cedar Park; Jay W. Dawson, Round Rock; Leonard A. Johnson, Austin, all of Tex.

[73] Assignee: Minnesota Mining and Manufacturing Company, St. Paul, Minn.

[21] Appl. No.: 683,519

[22] Filed: Jul. 12, 1996

[51] Int. Cl.$^6$ .................................................. G02F 1/01
[52] U.S. Cl. .................... 250/227.17; 324/96; 385/12
[58] Field of Search ................... 250/227.14, 227.17; 324/96; 385/12

[56] References Cited

U.S. PATENT DOCUMENTS

| | | | |
|---|---|---|---|
| 4,615,582 | 10/1986 | Lefevre et al. | 350/96.29 |
| 4,733,938 | 3/1988 | Lefevre et al. | 385/12 |
| 4,947,107 | 8/1990 | Doerfler et al. | 324/96 |
| 5,136,235 | 8/1992 | Brändle et al. | 324/96 |
| 5,416,860 | 5/1995 | Lee et al. | 385/12 |
| 5,450,006 | 9/1995 | Tatam | 250/227.17 |
| 5,463,312 | 10/1995 | Lutz et al. | 324/96 |
| 5,500,909 | 3/1996 | Meier | 385/12 |

FOREIGN PATENT DOCUMENTS

| | | |
|---|---|---|
| 0 657 740 A2 | 6/1995 | European Pat. Off. . |
| 2 325 939 | 9/1976 | France . |

OTHER PUBLICATIONS

Article entitled "Recent Progress In Optical Current Sensing Techniques" by Ning et al., 1995 American Institute of Physics, Rev. Sci. Instrum. 66(5), Woodbury NY. May 1995, pp. 3097–3111.

Geometrical separation between the birefringence components in Faraday–rotation fiber–optic current sensors, by A. Ben–Kish, et al., pp. 687–689, May 1, 1991, vol. 16, No. 9, Optics Letters.

Temperature insensitive fiber coil sensor for altimeters, by Y. Amai, et al., pp. 975–978, Mar. 1, 1990, vol. 29, No. 7, Applied Optics.

*Primary Examiner*—Stephone B. Allen
*Attorney, Agent, or Firm*—Gerald F. Chernivec

[57] ABSTRACT

A fiber optic subassembly for a Faraday-effect current sensor has an optical sensing fiber supported by a tubular holder in a square or rectangular configuration, with the three of the four corners thereof designed with bends which have a net zero bend-induced birefringence. The bends are formed by providing two loops which have effective angles of about 90°, the two loops lying in orthogonal planes, such that the fast axis of birefringence in the first loop is parallel to the slow axis of birefringence in the second loop, and the slow axis of birefringence in the first loop is parallel to the fast axis of birefringence in the second loop. In this manner, retardance accumulated in the first loop is offset by retardance accumulated in the second loop. If the loops are substantially identical, the offsetting of the retardance is effectively complete such that the bend exhibits negligible bend-induced birefringence.

22 Claims, 2 Drawing Sheets

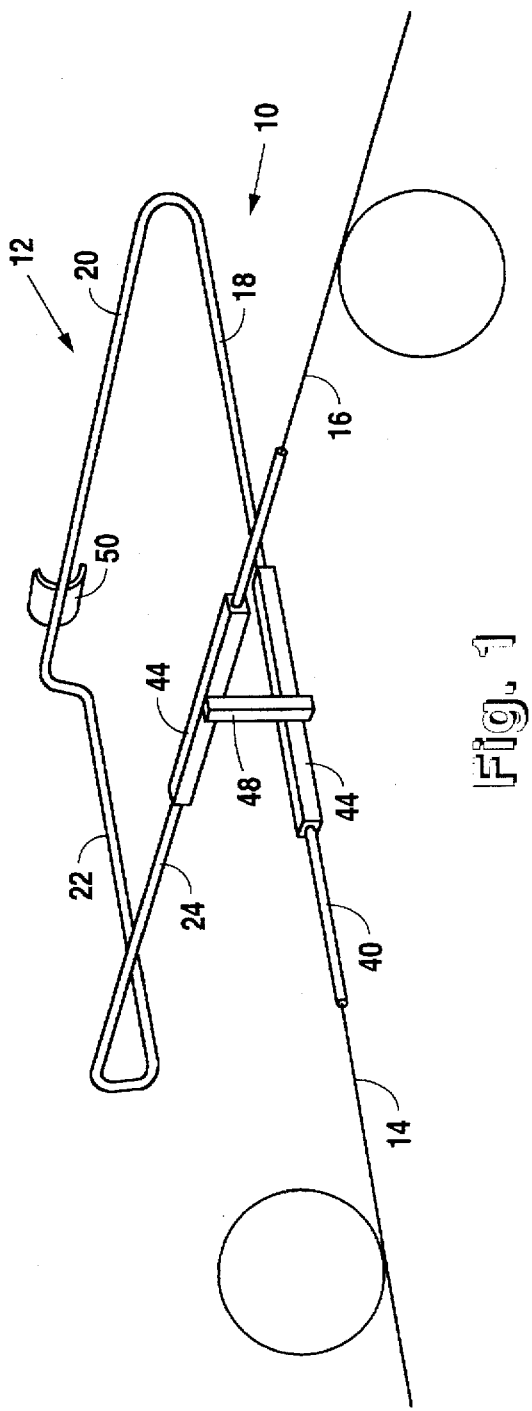
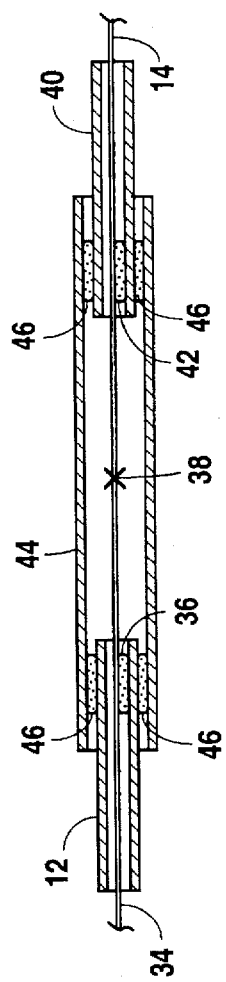
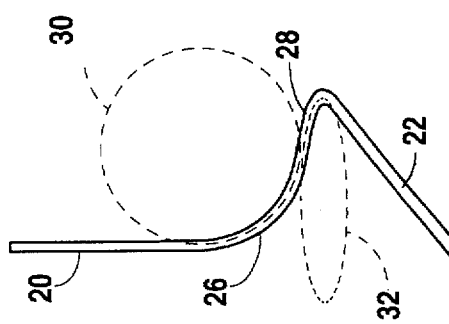

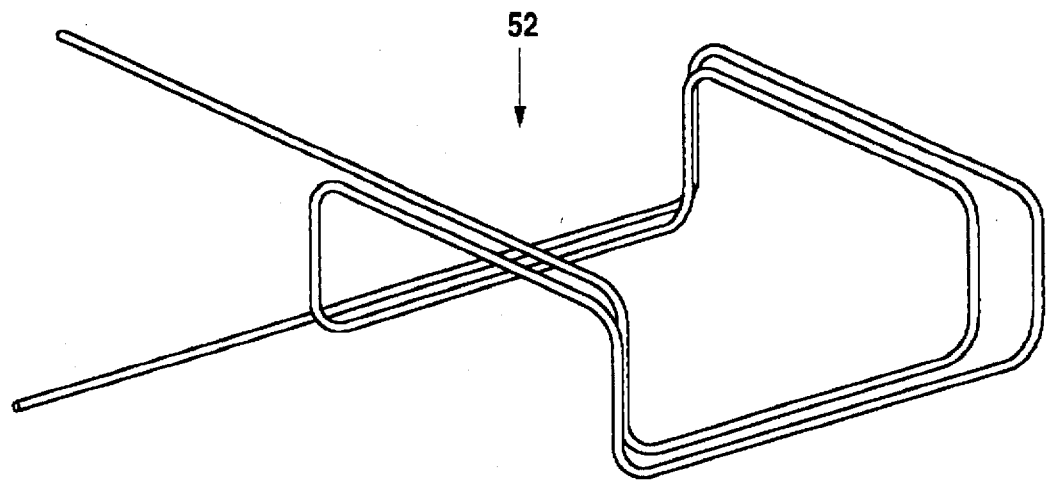
Fig. 4
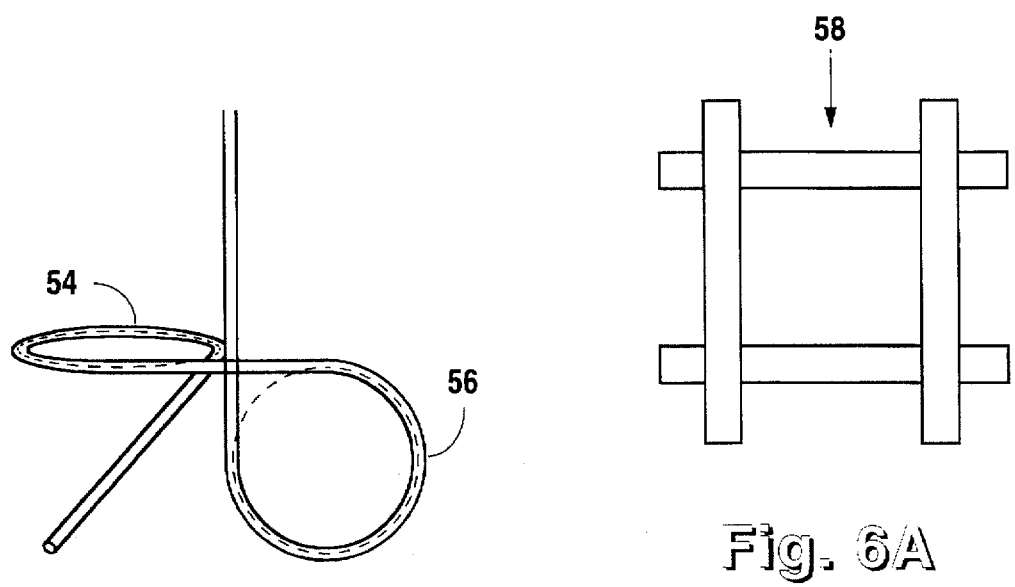
Fig. 5
Fig. 6A
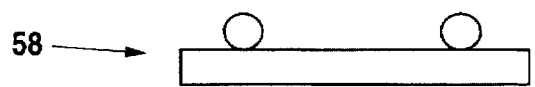
Fig. 6B

FIBER OPTIC CURRENT SENSOR WITH BEND BIREFRINGENCE COMPENSATION

BACKGROUND OF THE INVENTION

1. Field of the Invention

The present invention generally relates to Faraday effect, fiber optic current-sensors, and more particularly to an improved sensor which compensates for bend-induced variations, and a method for making such a sensor.

2. Description of the Prior Art

Optical fibers which are sensitive to magnetic fields are known in the art and are commonly used as optical current transducers (OCT's) for, e.g., electric power utilities. A typical OCT uses a single-mode fiber formed into a coil surrounding the electrical conductor. The polarization of any light traversing the fiber coil shifts, in response to the change in any current flowing through the conductor, as a result of the magneto-optic Faraday effect, also referred to as Faraday rotation or the Kundt effect. The Faraday effect is the manner in which the polarization of a beam of linearly polarized light rotates when it passes through matter in the direction of an applied magnetic field, and is the result of Faraday birefringence. Further discussion of field-sensitive optical fibers is provided in U.S. Pat. No. 5,051,577 assigned to Minnesota Mining and Manufacturing Co. (3M—assignee of the present invention).

Many prior art references recognize that the response of OCT's may vary considerably due to temperature variations, unacceptably so for highly precise OCT's which may be used in environments having widely varying temperature ranges, such as −40° to +80° C. Many techniques have been devised to minimize the influence of temperature changes. The most basic technique is to compensate the output based on empirical data, i.e., use a thermometer to determine the temperature during actual measurements, and allow post-processing electronics to adjust the output accordingly. A more complicated variation of this technique is disclosed in U.S. Pat. No. 5,382,901. A different approach is to minimize the temperature dependence by minimizing birefringence of the sensing fiber during its manufacture, such as by annealing it. Special materials for the sensing fiber may also be used to minimize fluctuations due to the changing Verdet constant, as disclosed in "Temperature Dependence of the Verdet Constant in Several Diamagnetic Glasses", Journal of Applied Optics, Vol. 30, No. 10, pp. 1176–1178 (Apr. 1, 1991).

Temperature sensitivity may also be caused by bend-induced birefringence. This may occur, for example, where a single sensing fiber is arranged in two or more straight sections to be placed about the current-carrying conductor, with loops of the fiber formed at the ends of the straight sections. Although the straight sections exhibit very little change in birefringence as a function of temperature, the loops can be extremely sensitive. The sensing head described in "Geometrical Separation Between the Birefringence Components in Faraday-Rotation Fiber-Optic Current Sensors," Optics Letters, Vol. 16, No. 9, pp. 687–689 (May 1, 1991), minimizes this effect by selecting the radii and number of turns of the loops so that the bend-induced birefringence is a multiple of $2\pi$. The loops at all corners are coplanar. In the depicted sensing head, the single sensing fiber has been formed into four straight sections generally forming a square about the conductor. While this construction does reduce bend-induced birefringence, it still remains unsuitable for many field applications where temperatures are extremes, and it also suffers from a common disadvantage of OCT's, that of installing the sensor on an "endless" cable, i.e., an existing cable that cannot be threaded through the sensor. Sensor coils, as well as square-shaped sensors, may be constructed to allow placement on an endless cable by providing a sufficient spacing between the coil loops or the sides of the square sensing fiber, but this increases the size of the sensor and can affect its accuracy.

A similar compensation scheme is described in U.S. Pat. No. 4,615,582, but only 180° turns are employed and temperature dependence is not addressed. The 180° turns do not permit the formation of a closed loop or path (essential to sensing current and not magnetic field) with zero net birefringence, but rather are used to sense a magnetic field which is unidirectional over the extent of the measurement section. Furthermore, the Faraday rotation of the light in the straight sections results in imperfect cancellation of the birefringence as this scheme also relies on creating a waveplate with a specific known birefringence (i.e., 180 degrees of retardation), which will not be stable with temperature. The '582 patent is not directed to a current sensor, but rather to a device that induces a specific amount of Faraday rotation into a light signal.

Another compensation scheme is shown in "Temperature Insensitive Fiber Coil Sensor for Altimeters", Journal of Applied Optics, Vol. 29, No. 7, pp. 975–978 (Mar. 1, 1990). The article describes the use of a polarization maintaining fiber which is broken and then refused. Polarization maintaining fiber cannot be used as a current sensor because of its inherently high linear birefringence, and additional concerns arise if splicing of fibers is required during manufacture of the sensor. It would, therefore, be desirable to devise a fiber-optic current sensor having improved temperature-dependence without the need for annealing or splicing the sensor fiber(s), and which could be fabricated without special materials, special optical components, or specially processed fibers. It would be further advantageous if the sensor could utilize straight sections of fiber to minimize bend-induced birefringence, and compensate for bend-induced birefringence created at the corners of such straight sections.

SUMMARY OF THE INVENTION

The present invention provides a fiber optic subassembly for a Faraday-effect sensor generally comprising an optical fiber having first and second ends and an intermediate sensing portion, and means for maintaining the sensing portion of the optical fiber in a substantially closed path wherein the sensing portion is formed into four straight sections generally defining a rectangle having four corners, at least one of the corners having a turn or bend with an effective angle of approximately 90°, the turn being configured to compensate for bend-induced birefringence. In particular, the turn has first and second 90° loops configured such that retardance accumulated in the first loop is offset by retardance accumulated in the second loop. In one embodiment, the first and second loops are each one-quarter turn loops, while in another embodiment they are each three-quarter turn loops. The first and second loops lie in orthogonal planes, with the fast axis of birefringence in the first loop being parallel to the slow axis of birefringence in the second loop, and the slow axis of birefringence in the first loop being parallel to the fast axis of birefringence in the second loop. If the loops are substantially identical, the offsetting of the retardance is effectively complete such that the bend exhibits negligible bend-induced birefringence. Preferably three of the four corners of the rectangle have such a construction, with the optical sensing fiber being supported by a tubular holder. The path formed by the holder, and hence the closed path of the optical sensing fiber, is most preferably a square. A hinge may be provided in the tubular holder to allow pivotal movement between two adjacent straight sections of the holder, so that the sensor subassembly may be placed about an existing current-carrying conductor. In a further embodiment, the tubular member is formed into the substantially closed path defining two rectangles, one lying inside the other.

BRIEF DESCRIPTION OF THE DRAWINGS

The invention will best be understood by reference to the accompanying drawings, wherein:

FIG. 1 is a perspective view of a fiber optic subassembly for a Faraday-effect sensor, constructed in accordance with the present invention;

FIG. 2 is a detail view of one corner of the tubular holder of FIG. 1, illustrating two loop portions at the bend which lie in orthogonal planes;

FIG. 3 is a side elevational view of an input end of the tubular holder of FIG. 1 with another tube surrounding the input polarizing fiber, and a splice protector attached to both of the tubes;

FIG. 4 is another embodiment of a fiber optic subassembly, having two overlapping squares defined by the tubular holder;

FIG. 5 is a detail view similar to FIG. 2 but showing a bend having three-quarter turn loops; and FIGS. 6A and 6B are a top plan view and a side elevational view, respectively, of a mandrel which can be used to support a fiber with the three-quarter turn loops of FIG. 5.

DESCRIPTION OF THE PREFERRED EMBODIMENT

With reference now to the figures, and in particular with reference to FIG. 1, there is depicted one embodiment 10 of a fiber optic subassembly for a Faraday-effect sensor, constructed according to the present invention. Fiber optic subassembly 10 is generally comprised of a tubular holder 12 containing an optical sensing fiber (not visible in FIG. 1), an input fiber 14 spliced to a first end of the sensing fiber, and an output fiber 16 spliced to a second end of the sensing fiber. Tubular holder 12 is shaped to form a substantially closed path, i.e., the path is not completely closed due to the need to connect the input and output ends of the sensing fiber to different input and output fibers, but the path is substantially closed in the sense that it is able to effectively surround a current-carrying conductor so the magnetic filed is substantially proportional to the current through the sensor per Ampere's Law. Thus the sensor's response is generally only to currents passing through the path or loop defined tubular holder 12, and the sensor has essentially no net response to currents external to the loop. The overall shape of holder 12 is rectangular, and preferably square, with four straight sections 18, 20, 22 and 24. As will become apparent, the inventive concept disclosed herein is of maximum advantage if the corners defined by tubular holder 12 are right angles, but a substantial advantage may still be achieved if the corners are not exactly 90°, so it is understood that the shape may be generally, and not perfectly, rectangular.

While square-shaped Faraday sensors are known in the art, they exhibit bend-induced birefringence at the bent corners of the sensing fiber, which adversely affect its temperature sensitivity. The sensing head described above (Optics Letters, May 1, 1991), minimizes this effect by making the bend-induced birefringence a multiple of $2\pi$, but this does not eliminate the birefringence. In contrast, the present invention provides a bend in the sensing fiber which exhibits negligible bend-induced birefringence, by providing two different loop portions at the bend such that retardance accumulated in the first loop is offset by retardance accumulated in the second loop. This is illustrated in FIG. 2, which shows a detail of one corner of tubular holder 12. The depicted corner is that where straight sections 20 and 22 meet, but the same geometry applies (inverted) at the other two bent corners of FIG. 1. This corner of holder 12 has two loops 26 and 28, with loop 26 stemming from straight section 20, and loop 28 stemming from straight section 22. The two loops 26 and 28 are joined at a central portion of the bend. In this embodiment, the curves associated with each loop are circular, as indicated by the dashed lines 30 and 32 associated with loops 26 and 28, respectively. The respective planes defined by the two loops (i.e., the planes of the two dashed circles) are generally orthogonal. In this manner, the fast axis of birefringence in the first loop is parallel to the slow axis of birefringence in the second loop (and the slow axis of birefringence in the first loop is parallel to the fast axis of birefringence in the second loop). The net effect of so combining these two loops at a single bend is to compensate or offset the bend-induced birefringence.

This compensation effect may be advantageous if even the net birefringence is not perfectly canceled out; however, by providing two loops which are essentially identical, the offset of the retardance may be effectively complete such that the bend exhibits negligible bend-induced birefringence (and the polarization state of the light is not changed from linear to elliptical as the light changes direction). The bend-induced birefringence is negligible in the sense that temperature dependence of the sensor is primarily due to linear birefringence. There is no bend-induced birefringence in the straight sections 18, 20, 22, 24. While the curvature of the loops depicted is that of a circle, other curves (elliptical, etc.) are suitable provided both loops at a given bend have substantially the same shape. So for the depicted embodiment, the radii of each loop should be equal.

Although only three of the corners in the square formed by tubular holder 12 of FIG. 1 are bent in the fashion taught herein, the fourth corner could also have such a bend to allow, e.g., the output fiber to exit from the subassembly in the same direction as (parallel to) the input fiber.

FIG. 3 illustrates one method of attaching the optical sensing fiber 34 to the input fiber 14. First, sensing fiber 34 is secured within tubular holder 12 by a drop of epoxy 36, with the terminal end of sensing fiber 34 only slightly extending beyond the end of tubular holder 12. A splice 38 is formed between sensing fiber 34 and input fiber 14, such as by fusion splicing. Another tubular piece 40 surrounding input fiber 14 is positioned near splice 38 (input fiber 14 may be inserted in tube 40 prior to making the splice). Tube 40 has an outer diameter approximately equal to the outer diameter of tubular holder 12. Another drop of epoxy 42 secures input fiber 14 to tube 40. A splice protector 44, having an inner diameter slightly greater than the outer diameters of tube 40 and tubular holder 12, is then slid over the ends of both tubular holder 12 and tube 40, and secured using additional epoxy 46.

The same method is used to attach output fiber 16 to the other end of sensing fiber 34. In other words, the sensing fiber is preferably longer than the path of the tubular holder, with one end of sensing fiber 34 exiting the first end of tubular holder 12, and the other end of sensing fiber 34 exiting the second end of tubular holder 14. It is possible, however, to have a sensing fiber which is shorter than the path of the tubular member. For example, the sensing fiber could be spliced to the input fiber and then inserted further into the tubular holder until the other end of the sensing fiber exits the output end of the tubular holder. The output fiber would then be spliced to the sensing fiber, and the sensing fiber re-inserted so that both splices are surrounded by the respective terminal portions of the tubular holder, thereby eliminating the need for splice protectors 44.

If splice protectors are used at each end, they may be further secured by attaching a reinforcement bar 48 to both protectors, as shown in FIG. 1, imparting greater structural integrity to tubular holder 12 as well. Reinforcement bar 48 is attached to central portions of each splice protector, and is generally orthogonal to each splice protector.

In the preferred embodiment, tubular holder 12 is a glass (Pyrex) tube having a 1 mm inner diameter and a 3 mm outer diameter, splice protectors 44 are glass (Pyrex) with a 3 mm inner diameter and a 5 mm outer diameter, and reinforcement bar 48 is glass (Pyrex), 2 mm outer diameter. Using the same material for tubular holder 12, splice protectors 44 and reinforcement bar 48 further reduces temperature sensitivity since all support components have the same coefficient of expansion, preferably close to that of the optical fibers (glass). Tubular holder 12 may be formed into the appropriate shape by heating and deforming it against a mandrel or mold. A hinge 50 may be formed, e.g., at any one of the three corner bends, to allow the subassembly to be placed around an existing conductor which cannot be threaded through the closed path of tubular holder 12.

The preferred types of fibers used with the present invention are available from 3M Specialty Optical Fibers in West Haven, Conn. Input fiber 14 is a polarizing (PZ) fiber available under part number FS-PZ-4611/200SA (operating wavelength 850 nm). Output fiber 16 is a polarization maintaining (PM) fiber available under part number FS-PM-4611/200SA (operating wavelength 820 nm). Sensing fiber 34 is a spun, unannealed, single mode fiber available under part number FS-SM4611 (operating wavelength 780 nm), with a dual acrylate coating for temperature cycling. This coating is the same as that on the PM fiber, a soft silicone inner coat and a harder acrylate outer coat. The inner coat has a low $T_g$ that remains gel-like throughout the temperature range, and hence hoes not squeeze the fiber which might induce birefringence in the straight sections. Also, the fiber is spun between 5 and 40 times per meter (spun beatlength of about 2.5–20 cm, resulting in a fiber with a straight beatlength of about 100+ meters), which reduces the linear birefringence in the straight sections of the sensor. The output fiber is spliced to the sensing fiber in such a way that the birefringence axes of the output fiber are at 45° with respect to the plane of polarization of light coming out of the sensing fiber with no current applied. A suitable glue used to adhere the fibers is the UV cured epoxy NOA #72 from Norland Products of New Brunswick, N.J. A suitable glue for adhering splice protectors 44 to tubes 40, and for adhering reinforcement bar 48 to splice protectors 44, is available from Electronic Materials of Danbury, Conn., under part number XP1060-930-45-1A.

Temperature sensitivity of fiber optic subassembly 10 due to bend-induced birefringence is minimized without annealing the sensing fiber, a step that would complicate the fabrication of the subassembly. For example, annealing would require a higher quality glass than Pyrex, and would also vaporize the dual acrylate coating on the sensing fiber. Nevertheless, one could certainly use an annealed fiber for sensing fiber 34, but satisfactory results may be obtained with an unannealed fiber as a result of the net zero birefringence at the corners of subassembly 10. Another advantage of the birefringence compensation scheme of the present invention is that it is wavelength independent.

The dimensions of subassembly 10 may vary according to the size or shape of the conductor which is to be monitored. The following approximate dimensions are considered exemplary. Tubular holder 12 forms a square having 10 cm sides (including the portions of splice protectors 44 which form part of the square at one corner). Loops 26 and 28 have radii of 2 cm. Optical sensing fiber 34 is 54 cm long (each end of the sensing fiber protrudes 2 cm out of tubular holder 12). Tubes 40 are 4 cm long, splice protectors 44 are 5 cm long, and reinforcement bar 48 is 5 cm long.

Fiber optic subassembly 10 is intended for use with various conventional components of a complete Faraday sensor system. While those components are beyond the scope of the present invention, the following are typical: a light source coupled to input fiber 14 (such as the laser diode optical package available from Point Source Ltd. of Winchester, England, under part number LDS-Pz-3-K-780-0.5-TE; or alternatively a super-luminescent diode manufactured by EG&G Optoelectronics of Vaudreuil, Canada); and a detector coupled to output fiber 16 (such as the Si photo-detector model number 260 from Graseby Optronics of Orlando, Fla.). A polarizer or polarizing beam splitter is aligned with the axes of PM output fiber 16. A PZ fiber may also be used in place of the PM output fiber.

FIG. 4 illustrates an alternative tubular holder 52 for a fiber optic subassembly for a Faraday-effect current sensor, similar to tubular holder 12, except that tubular holder 52 is effectively formed with two squares, one lying just inside the other, to increase the sensitivity of the sensor. More than two squares may be similarly formed. Multiple hinges can be provided in such multiple square sensors to allow the subassembly to be placed around an existing conductor.

In FIGS. 1, 2 and 4, each loop portion 26 and 28 individually bends a total angle of about 90°, and the loops are one-quarter turn loops (so the term "loop" is not meant to require a full winding of 360° or more). Those skilled in the art will appreciate that other types of loops are equivalent if they also have an effective angle of approximately 90°. For example, FIG. 5 depicts a fiber bend having two circular, three-quarter turn loops 54 and 56. These loops also have an effective angle of 90°, and are formed in orthogonal planes. Of course, larger loops may be formed by simply adding one or more full turns to the geometry of either FIG. 2 or FIG. 5. In other words, two circular loops can have the same number of turns T given by the equation $T=[(n\times 2)-1]/4$ where n is an integer value of 1 or more.

The winding of FIG. 5 may conveniently be made on a mandrel or frame 58 as shown in FIGS. 6A and 6B, constructed of four members or rods assembled in a square fashion with two parallel rods overlying the other two rods. Annular grooves may be formed at appropriate locations along the rods to guide the sensing fiber in the geometry of FIG. 5. An exemplary frame 58 has rods of 1" (2.54 cm) outer diameter each, with about 1" (2.54 cm) of each rod extending beyond the corner crossings.

The present invention may be combined with other techniques for improving accuracy in a Faraday current sensor. The method taught in U.S. patent application Ser. No. 08/539,059 may provide further improvement by selecting a preferred sensing axis of the sensing fiber to compensate for changes in the Verdet constant. The present invention may also be used to provide two subassemblies for the differential current sensor of U.S. patent application Ser. No. 08/561,810.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

We claim:

1. A fiber optic subassembly for a Faraday-effect sensor, the subassembly comprising:
   an optical fiber having first and second ends and an intermediate sensing portion; and
   means for maintaining said sensing portion of said optical fiber in a substantially closed path wherein said sensing portion is formed into four straight sections generally defining a rectangle having four corners, at least one of said corners having a turn of said sensing portion with an effective angle of approximately 90°, said turn being configured to compensate for bend-induced birefringence.

2. The fiber optic subassembly of claim 1 wherein three of said corners have a bend of said sensing portion with effective angles of approximately 90°, each of said bends being configured to compensate for bend-induced birefringence.

3. The fiber optic subassembly of claim 1 wherein said four straight sections further generally define a square.

4. The fiber optic subassembly of claim 1 wherein said first and second ends of said fiber overlie one another at one of said corners.

5. The fiber optic subassembly of claim 1 wherein said bend includes first and second 90° loops configured such that retardance accumulated in said first loop is offset by retardance accumulated in said second loop.

6. The fiber optic subassembly of claim 1 wherein said maintaining means includes hinge means allowing pivotal movement between two adjacent straight sections of said sensing portion of said fiber.

7. The fiber optic subassembly of claim 1 wherein compensation for said bend-induced birefringence is independent of the wavelength of light travelling in said optical fiber.

8. The fiber optic subassembly of claim 5 wherein said first and second loops are each one-quarter turn loops.

9. The fiber optic subassembly of claim 5 wherein said first and second loops are each three-quarter turn loops.

10. The fiber optic subassembly of claim 5 wherein:
    said first and second loops each have fast and slow axes of birefringence;
    said fast axis of birefringence in said first loop is parallel to said slow axis of birefringence in said second loop; and
    said slow axis of birefiingence in said first loop is parallel to said fast axis of birefringence in said second loop.

11. The fiber optic subassembly of claim 5 wherein said first and second loops lie in orthogonal planes.

12. The fiber optic subassembly of claim 5 wherein said offset of said retardance is effectively complete such that said bend exhibits negligible bend-induced birefringence.

13. A Faraday-effect current sensor comprising:
    a tubular member having first and second ends, forming a substantially closed path having four straight sections generally defining a rectangle with four corners connecting said straight sections, at least one of said corners having a turn with an effective angle of approximately 90°, said turn including first and second 90° loop portions, said first and second loop portions lying in orthogonal planes and being essentially identical in shape; and
    an optical sensing fiber inserted in said tubular member such that a first end of said optical fiber exits said first end of said tubular member, and a second end of said optical fiber exits said second end of said tubular member.

14. The Faraday-effect current sensor of claim 13 wherein said first and second loop portions are each quarter turn loops.

15. The Faraday-effect current sensor of claim 13 wherein said four straight sections further generally define a square.

16. The Faraday-effect current sensor of claim 13 wherein said first and second ends of said fiber overlie one another at one of said corners.

17. The Faraday-effect current sensor of claim 13 wherein said tubular member is hinged at one of said corners to allow pivotal movement between an adjacent pair of said straight sections.

18. The Faraday-effect current sensor of claim 13 further comprising:
    an input polarizing fiber spliced to said first end of said fiber;
    an output polarization maintaining fiber spliced to said second end of said fiber;
    a first tube surrounding a portion of said input polarizing fiber;
    a second tube surrounding a portion of said output polarization maintaining fiber;
    a first splice protector surrounding said first end of said fiber, said first splice protector having a first end attached to said first end of said tubular member and a second end attached to said first tube;
    a second splice protector surrounding said second end of said fiber, said second splice protector having a first end attached to said second end of said tubular member and a second end attached to said second tube; and
    a reinforcing member attached to said first and second splice protectors.

19. The Faraday-effect current sensor of claim 13 further comprising:
    an input polarizing fiber spliced to said first end of said fiber;
    an output polarizing fiber spliced to said second end of said fiber;
    a first tube surrounding a portion of said input polarizing fiber;
    a second tube surrounding a portion of said output polarization maintaining fiber;
    a first splice protector surrounding said first end of said fiber, said first splice protector having a first end attached to said first end of said tubular member and a second end attached to said first tube;
    a second splice protector surrounding said second end of said fiber, said second splice protector having a first end attached to said second end of said tubular member and a second end attached to said second tube; and
    a reinforcing member attached to said first and second splice protectors.

20. A method of manufacturing a Faraday-effect current sensor, comprising the steps of:

forming a tubular member having first and second ends into a substantially closed path having four straight sections generally defining a rectangle with four corners connecting said straight sections, at least one of said corners having a turn with an effective angle of approximately 90°, said turn including first and second 90° loop portions, said first and second loop portions lying in orthogonal planes and being identical in shape;

inserting an optical sensing fiber into said tubular member; and securing said fiber in said tubular member such that a first end of said optical fiber exits said first end of said tubular member, and a second end of said optical fiber exits said second end of said tubular member.

21. The method of claim 20 further comprising the steps of:

splicing a polarizing fiber to said first end of said optical fiber;

placing a first tube about a portion of said polarizing fiber;

attaching a first splice protector to said first end of said tubular member and an end of said first tube such that said first splice protector surrounds a splice between said polarizing fiber and said first end of said optical fiber;

splicing a polarization maintaining fiber to said second end of said optical fiber;

placing a second tube about a portion of said polarization maintaining fiber; and attaching a second splice protector to said second end of said tubular member and an end of said second tube such that said second splice protector surrounds a splice between said polarizing fiber and said second end of said optical fiber.

22. The method of claim 20 wherein said tubular member is formed into said substantially closed path defining two rectangles, one lying inside the other.

* * * * *